United States Patent
Son et al.

(10) Patent No.: US 7,247,936 B2
(45) Date of Patent: Jul. 24, 2007

(54) TAPE CIRCUIT SUBSTRATE HAVING WAVY BEAM LEADS AND SEMICONDUCTOR CHIP PACKAGE USING THE SAME

(75) Inventors: Dae-Woo Son, Chungcheongnam-do (KR); Jin-Hyuk Lee, Seoul (KR); Kwan-Jai Lee, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 201 days.

(21) Appl. No.: 10/739,456

(22) Filed: Dec. 17, 2003

(65) Prior Publication Data

US 2004/0178501 A1    Sep. 16, 2004

(30) Foreign Application Priority Data

Mar. 11, 2003  (KR) ............... 10-2003-0015179

(51) Int. Cl.
*H01L 23/48* (2006.01)
(52) U.S. Cl. .................. 257/690; 257/696; 257/735
(58) Field of Classification Search ........... 257/735, 257/690, 696
See application file for complete search history.

(56) References Cited

U.S. PATENT DOCUMENTS 5,744,859 A * 4/1998 Ouchida ............... 257/668
6,037,662 A * 3/2000 Yoon et al. ............ 257/735
6,278,176 B1 * 8/2001 Nakamura et al. ........ 257/668

FOREIGN PATENT DOCUMENTS

| JP | 08-316270 | 11/1996 |
| JP | 10-261673 | 9/1998 |
| JP | 2001255550 | 9/2001 |
| KR | 1997-58422 | 7/1997 |
| KR | 1999-69806 | 9/1999 |

OTHER PUBLICATIONS

English language abstract of Japanese Publication No. 08-316270, Nov. 29, 1996.
English language abstract of Korean Publication No. 10-282003, Nov. 23, 2000.
English abstract of Korean Publication No. 1999-69806, Sep. 6, 1999.
English abstract of Korean Publication No. 1997-58422, Jul. 31, 1997.
English abstract of Japanese Publication No. JP2001255550, Sep. 21, 2001.
English abstract of Japanese Publication No. 10-261673, Sep. 29, 1998.

* cited by examiner

*Primary Examiner*—Douglas W. Owens
(74) *Attorney, Agent, or Firm*—Marger Johnson & McCollom, P.C.

(57) ABSTRACT

A semiconductor chip package includes an IC chip and a tape circuit substrate. The tape circuit substrate has a base film and a plurality of beam leads formed on the base film. One end portion of each beam lead extends from the base film, and the extended portion has a widthwise wavy portion. The widthwise wavy portion may be, for example, semicircular shaped, S-shaped or zig-zag shaped. The IC chip has chip pads formed on a top surface thereof.

39 Claims, 10 Drawing Sheets

TAPE CIRCUIT SUBSTRATE HAVING WAVY BEAM LEADS AND SEMICONDUCTOR CHIP PACKAGE USING THE SAME

This application claims priority from Korean Patent Application No. 2002-15179, filed on Mar. 11, 2003, the contents of which are incorporated herein by reference in their entirety.

BACKGROUND OF THE INVENTION

1. Field of the Invention

The present invention relates to semiconductor packaging technology, and more particularly, to a semiconductor chip package having a tape circuit substrate with beam leads.

2. Description of the Related Art

With the current trend of high integration in semiconductor devices, semiconductor packaging and interconnect technologies are becoming very important. Moreover, as market demand for mobile handsets and liquid crystal displays (LCDs) increases, there will be a growing demand to make the semiconductor chip packages smaller, thinner, lighter, and more multifunctional. To meet this trend, several types of semiconductor packages using a tape circuit substrate have been developed and introduced. For example, a tape carrier package (TCP), a chip-on-film (COF) package, a micro ball grid array (μ-BGA) package and so on fall within these package types.

In general, a semiconductor chip package having a tape circuit substrate uses what is called a TAB (tape automated bonding) technique to establish a connection between an integrated circuit (IC) chip and the tape circuit substrate. A typical package using the tape circuit substrate is shown in FIGS. 1A and 1B. FIG. 1A is a plan view and FIG. 1B is a cross-sectional view taken along the line IB—IB of FIG. 1A.

Referring FIGS. 1A and 1B, a conventional semiconductor package 100 is shown to include an IC chip 20. The IC chip 20 has a large number of chip pads 21 formed on the top surface thereof. A chip bump 22 is formed on each chip pad 21. A tape circuit substrate 10 has a base film 11, a large number of beam leads 12, and a protective layer 13. The base film 11 is made of a polyimide, having a rectangular opening 14 formed at central portions. The chip bumps 22 on top of the IC chip 20, is exposed through the opening 14 of the base film 11. The beam leads 12, which are made of copper, are formed on the bottom surface of the base film 11, and their ends are protruded into the opening 14. The protective layer 13, which can be made of a solder resist material, is formed on the bottom surface of the base film 11 to cover the beam leads 12.

The ends of the beam leads 12, which as previously mentioned are protruded into the opening 14, are bonded onto the chip bumps 22, respectively, using mechanical pressure at a temperature of about 500° C. This is widely known as an inner lead bonding (ILB) process of the TAB technique. Unlike a wire bonding technique, the ILB process of TAB technique has the advantage of allowing gang bonding between the chip pads 21 and the beam leads 12. After the ILB process is completed, a sealing resin 23 encapsulates the top and side surfaces of the IC chip 20 as well as the protruded beam leads 12.

Unfortunately, the typical package 100 discussed above has a reliability problem due to differences in the coefficient of thermal expansion (CTE) between components of the tape circuit substrate 10. As described above, the tape circuit substrate 10 is composed of the polyimide base film 11, the copper beam leads 12, and the solder resist protective layer 13, each having different CTEs of about 20 ppm/° C., about 17 ppm/° C. and about 160 ppm/° C., respectively. Therefore, as depicted in FIG. 2, these components expand due to heat at different rates during the ILB process, which incorporates high temperature and high pressure. This causes thermal mechanical stress (S) in the beam lead 12 bonded to the chip bump 22, resulting in a crack or a break at the bended portion 12a of the beam lead 12. This type of unfavorable defect is also illustrated in FIG. 3.

SUMMARY OF THE INVENTION

The present invention provides a tape circuit substrate comprising a base film; and a plurality of beam leads adjacent the base film, each beam lead including a wavy portion.

In one embodiment, the base film may be a flexible film. Moreover, the wavy portion of the beam lead may be a semicircular wavy portion, an S-shaped wavy portion, or a zigzag wavy portion.

Further, the present invention provides a semiconductor chip package that includes an integrated circuit (IC) chip and a tape circuit substrate. The IC chip has a plurality of chip pads formed on its top surface. The tape circuit substrate has a base film and a plurality of beam leads formed on a first surface of the base film. In particular, one end portion of each beam lead is protruded toward the chip pad from the base film and bonded to the chip pad. The protruded portion of each beam lead has a wavy portion, which serves to disperse the stress produced in the beam lead during an inner lead bonding (ILB) process. Therefore, the wavy portion effectively prevents a crack or a break of the beam lead, thereby improving interconnection reliability between the IC chip and the tape circuit substrate.

In the semiconductor chip package according to an embodiment of the present invention, the base film may be a flexible film. In addition, the wavy portion of the beam lead can be semicircular shaped, S-shaped, or zigzag shaped. The wavy portion can also have a neck part, a bent part, and an end part. The IC chip may further have a plurality of chip bumps, each of which is formed on the chip pad.

The package of the present invention can further include a sealing resin that encapsulates the chip pads and the wavy portions of the beam leads. In the package, the other end portion of each beam lead may be an external connection terminal. In addition, the base film may have an opening formed on a central portion thereof so that the chip pads are exposed through the opening. In this case, the first surface of the base film may face toward the top surface of the IC chip or alternatively face the same direction as the top surface of the IC chip. The base film may cover the top surface of the IC chip, and the first surface of the base film may face toward the top surface of the IC chip. Further, the tape circuit substrate may have a protective layer covering the beam leads and the first surface of the base film.

The present invention further provides a semiconductor chip package that has an IC chip and a tape circuit substrate. The IC chip has chip pads formed on its top surface. The tape circuit substrate has a base film, beam leads formed on a first surface of the base film, and solder balls formed on a second surface of the base film. In particular, a first end portion of each beam lead is electrically connected to the solder ball, and a second end portion of each beam lead is protruded toward the chip pad from the base film and bonded to the chip pad. Additionally, the protruded portion of each beam lead has a wavy portion.

In this semiconductor chip package of the present invention, the tape circuit substrate may be located above the IC chip so that the chip pads can be exposed outside of the tape circuit substrate. Moreover, the chip pads may be arranged along peripheral regions and/or central regions of the top surface of the IC chip. The package may further have an adhesive, which is interposed between the first surface of the tape circuit and the top surface of the IC chip. The adhesive may be an epoxy resin, an elastomeric polymer, or a silicone polymer.

DETAILED DESCRIPTION OF THE INVENTION

Figure 1A:
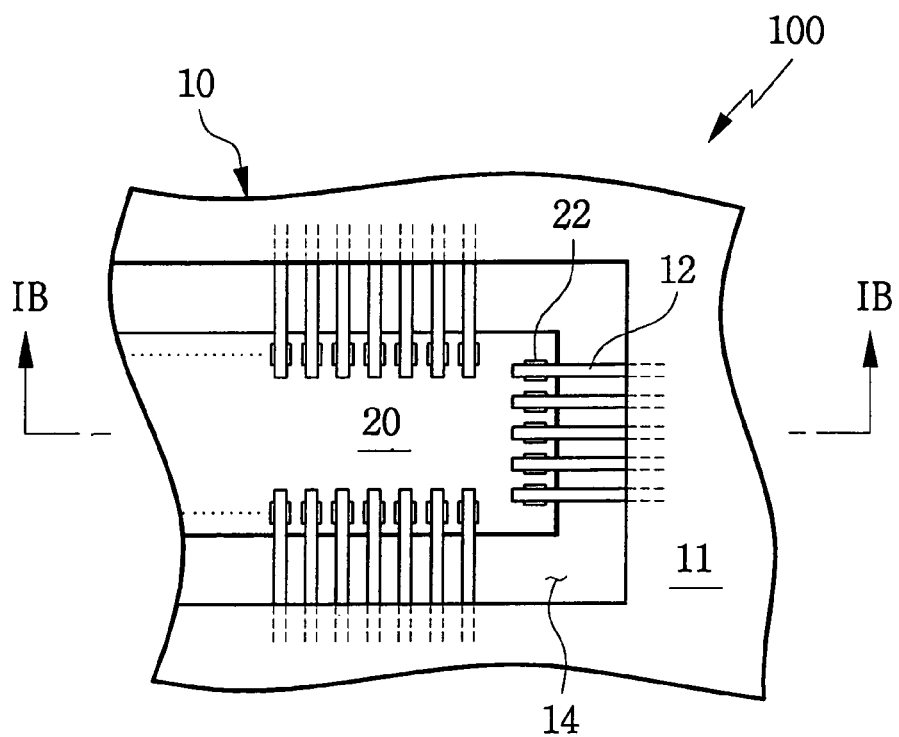
FIGS. 1A and 1B are respectively a plan view and a cross-sectional view showing a conventional semiconductor chip package using a tape circuit substrate.
Figure 1B:
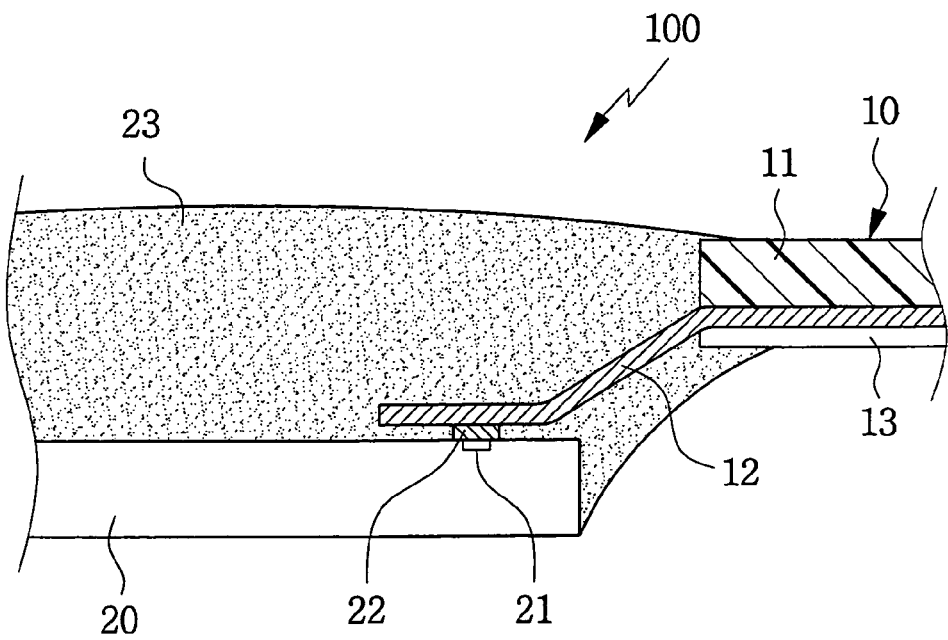
Figure 2:
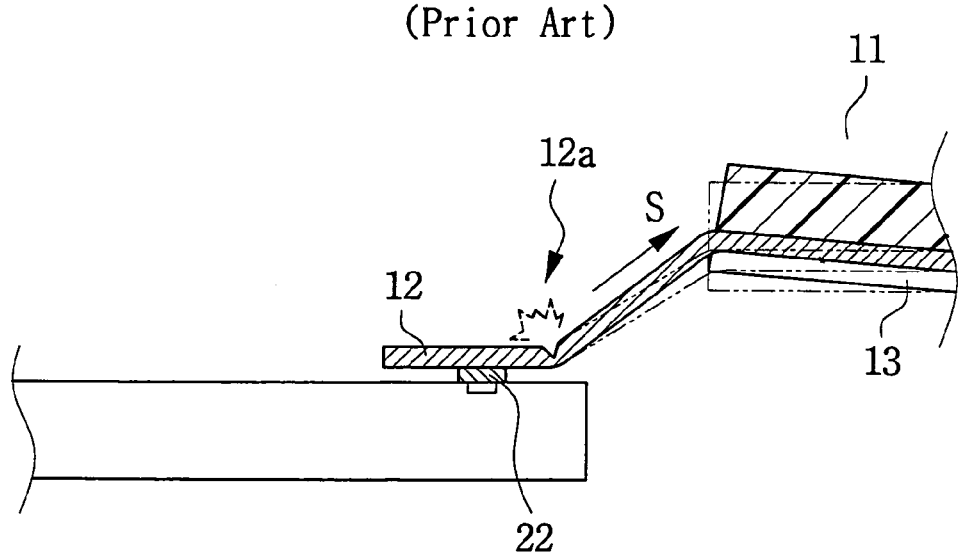
FIG. 2 is an illustration showing a defect in a beam lead of a conventional semiconductor chip package.

The present invention will now be described more fully hereinafter with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. For purposes of illustration, some elements are exaggerated, outlined, or omitted in the drawings. Further, same reference numbers represent same elements.

Figure 4A:
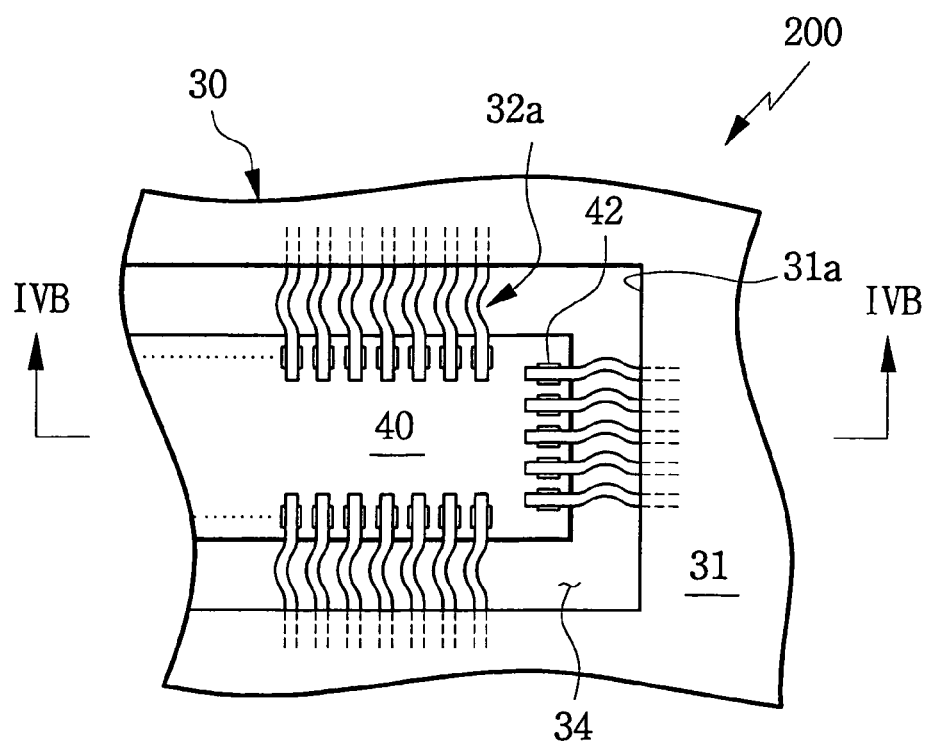
FIG. 4A is a plan view showing a semiconductor chip package according to a first embodiment of the present invention.
Figure 3:
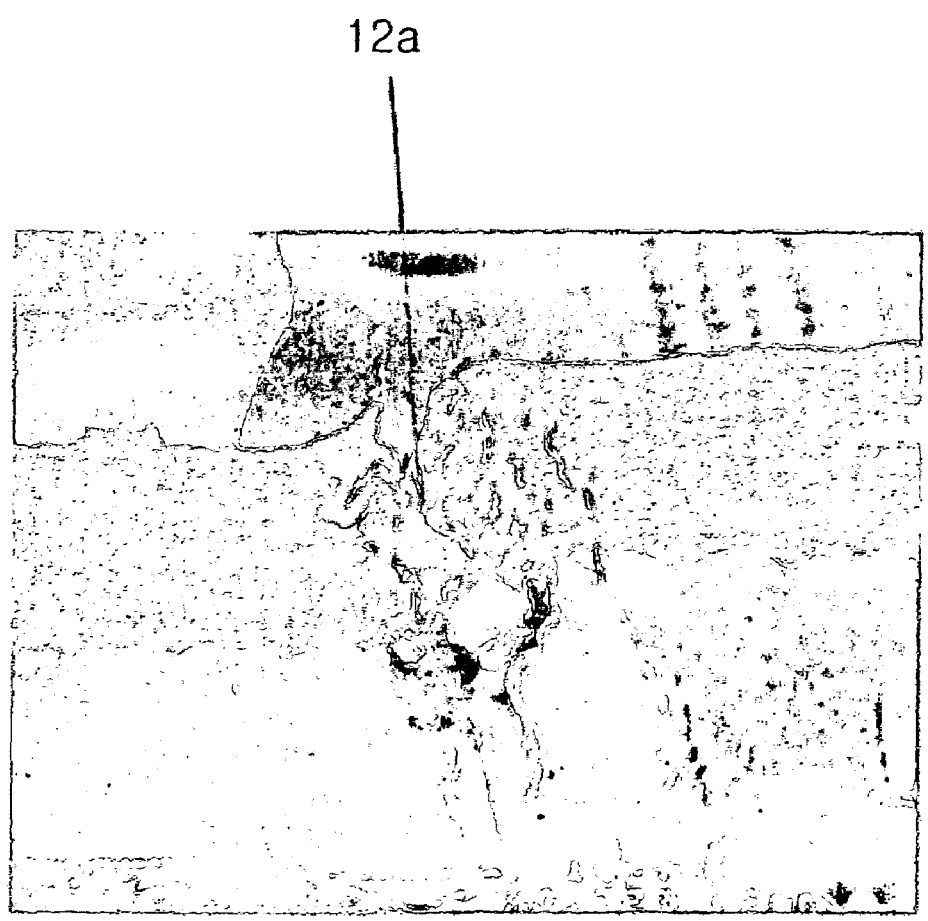
FIG. 3 is a photograph taken by a scanning electron microscope (SEM) showing the beam lead defect in FIG. 2.
Figure 4B:
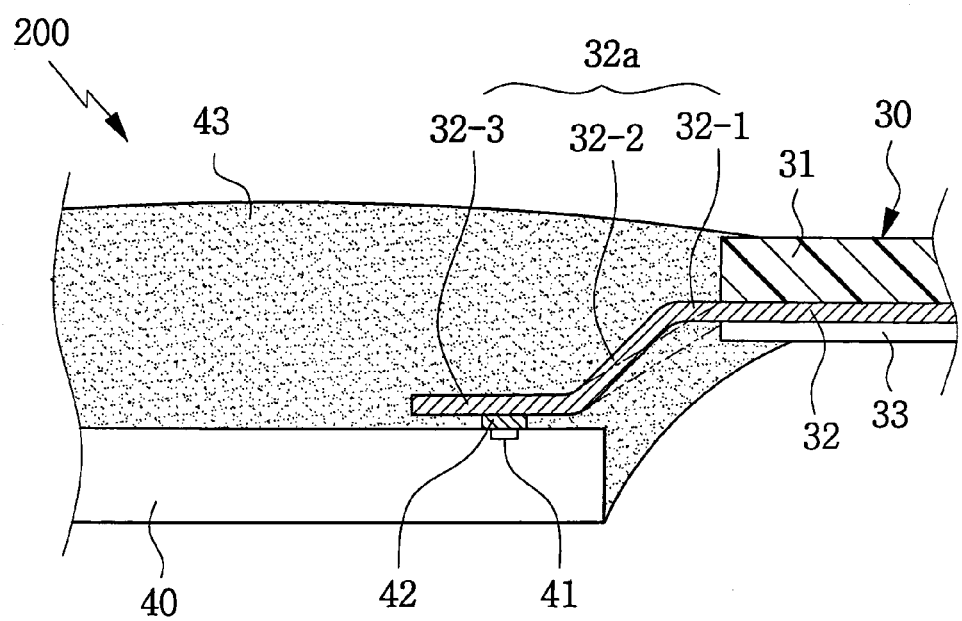
FIG. 4B is a cross-sectional view taken along line IVB—IVB of FIG. 4A.

Referring to FIGS. 4A and 4B, a package 200 includes a tape circuit substrate 30 and an integrated circuit (IC) chip 40, both of which are interconnected, preferably, using the ILB process of the TAB technique.

For example, the IC chip 40 may be a LCD driver IC (LDI) chip that drives an LCD panel, but it is not always limited to this. The IC chip 40 has a plurality of chip pads 41, which are arranged on the top surface, i.e., the active surface, of the IC chip 40. On each chip pad 41, a chip bump 42 is formed with a conductive material such as gold (Au), copper (Cu), nickel (Ni), solder and so on.

The tape circuit substrate 30 has a base film 31, a plurality of beam leads 32, and a protective layer 33. Preferably, the base film 31 is a flexible film such as a polyimide film. The base film 31 has an opening 34 at central portions. The opening 34 may have a rectangular-shape, or any other suitable shapes. The top surface of the IC chip 40 is wholly or partially exposed through the opening 34 for the ILB process. The beam leads 32 are formed on the bottom surface of the base film 31.

As an example of forming the beam leads 32, a copper foil can be laminated onto the base film 31 and cured. Next, a photolithographic technique may be used to create the specific pattern of the beam leads 32. The beam lead pattern is plated with a metal, such as nickel or gold. As appreciated by those skilled in the art, this is no more than a preferred method for forming the beam leads 32. Respective inner portions of the beam leads 32 are protruded in the opening 34 for the ILB process. The protective layer 33, which is made of, for example, a solder resist material, covers the beam leads 32 and the bottom surface of the base film 31.

The inner end 32-3 of each beam lead 32 is bonded to the chip bump 42 in the opening 34 though the ILB process. Then a sealing resin 43, such as epoxy, encapsulates the inner portions of the beam leads 32 in the opening 34 together with the top and side surfaces of the IC chip 40. For clarity in illustration, FIG. 4A does not show the sealing resin 43. The outer end (not shown) of each beam lead acts as an external connection terminal, which is connected to other kinds of circuitry boards, such as a printed circuit board or an LCD panel. A detailed description regarding this will be given later with reference to FIG. 8.

Figure 5A:
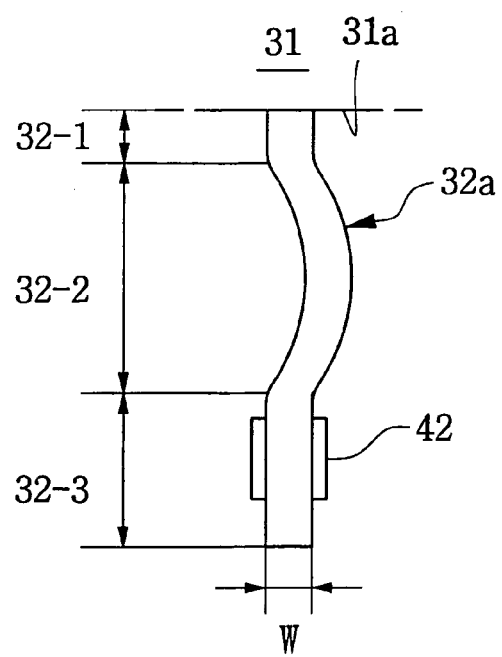
FIGS. 5A to 5C are enlarged plan views showing exemplary beam leads of a tape circuit substrate according to the present invention.
Figure 5B:
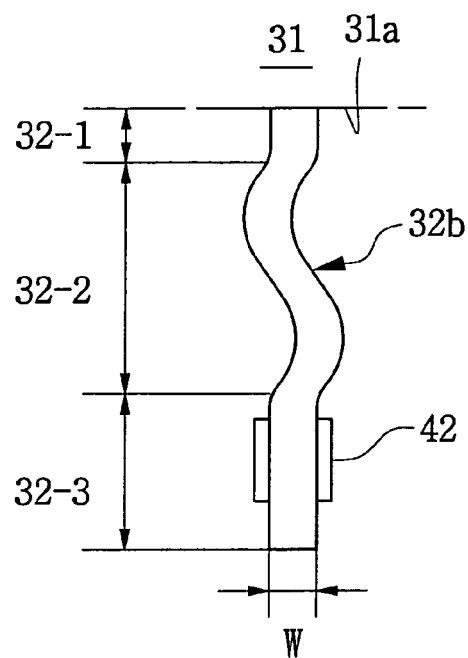
Figure 5C:
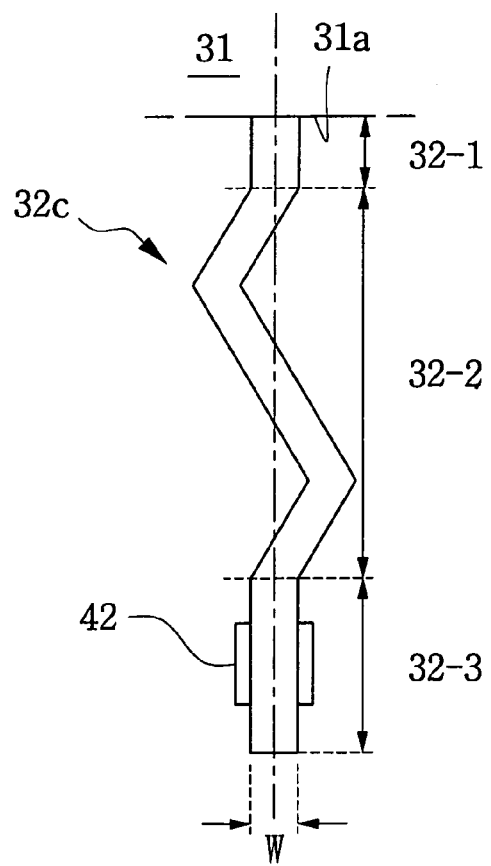

The inner portion of each beam lead 32 has a wavy shape that moves widthwise in a wavelike form. This lead portion, i.e., the portion protruded from the inside edge 31a of the base film 31 to the opening 34, will be hereinafter referred to as the wavy portion 32a of the beam lead 32. FIGS. 5A to 5C show, in plan views, exemplary shapes of the wavy portions 32a, 32b and 32c, that is, a semicircular wavy portion 32a, an S-shaped wavy portion 32b and a zigzag wavy portion 32c, respectively. The shape and dimension of this wavy portion are determined according to the width and thickness of the beam lead, process conditions and so on.

Referring to FIGS. 4B, 5A, 5B, and 5C, the wavy portion 32a, 32b, or 32c is composed of a neck part 32-1, a bent part 32-2, and an inner end part 32-3. The neck part 32-1 starts from the inside edge 31a of the base film 31 and extends straight at a right angle to the inside edge 31a. For example, the length of the neck part 32-1 is determined depending on a distance from the inside edge 31a of the base film 31 to the chip pad 41 or the chip bump 42 of the IC chip 40. The length of the neck part 32-1 ranges from about 40 µm to about 80 µm, preferably from about 55 µm to 75 µm.

The bent part 32-2 prevents a crack or a break of the beam lead and improves interconnection reliability between the IC chip and the tape circuit board. As described above, the bent part 32-2 may have a semicircular shape, an S-shape, a zigzag shape and so on. Like the neck part 32-1, the length of the bent part 32-2 may be determined depending on a distance from the inside edge 31a of the base film 31 to the chip pad 41 or the chip bump 42 of the IC chip 40. The length of the bent part 32-2 ranges from about 100 µm to about 500 µm, preferably from 150 µm to 450 µm.

The inner end part 32-3, which preferably lies such that it appears to be an extension of the neck part 32-1, is bonded onto the chip pad 41 or the chip bump 42 through the ILB process. The length of the inner end part 32-3 may be varied depending on a distance from the inside edge 31a of the base film 31 to the chip pad 41 or the chip bump 42. In addition, the length of the inner end part 32-3 may be varied in consideration of the size of the chip pad 41 or the chip bump 42.

The width (W) of the beam lead can be determined by depending on the size of the chip pad 41 and the chip bump 42. The width of the beam lead is about 50 µm or under, preferably from about 10 µm to 30 µm.

Although some examples of the wavy portions are shown in FIGS. 5A–5C, the present invention is not limited to these. One skilled in the art will appreciate that the wavy portions may be any part of the inner portion of the beam lead that deviates from a straight line between the neck part and the inner end part.

Returning to FIGS. 4A and 4B, the wavy portion 32a of the beam lead 32 disperses the stress produced in the beam lead 32 due to the ILB process. Therefore, the wavy portion 32a effectively prevents a crack or a break in the beam lead 32, thereby improving interconnection reliability between the IC chip 40 and the tape circuit substrate 30. Additionally, the wavy portion 32a of the beam lead 32 extends straight into the opening 34 at the neck part 32-1 and then bends toward the chip bump 42 at the bent part 32-2. This also disperses the stress in the beam lead 32. In a conventional structure, for comparison, the conventional beam lead bends downward just at the inside edge of the base film 31. This is illustrated in FIG. 4B as the phantom lines for visual comparison.

Figure 6:
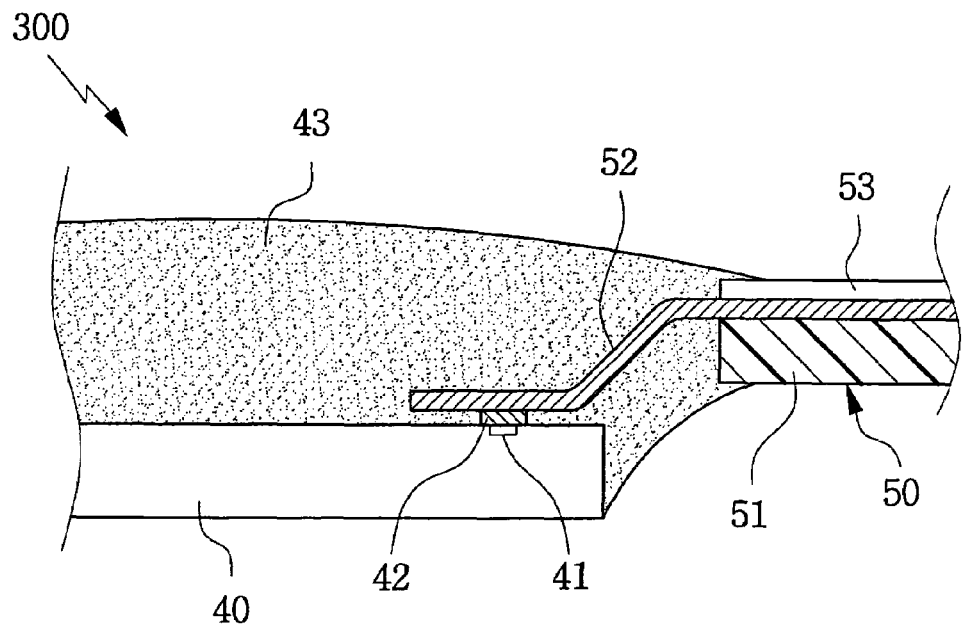
FIG. 6 is a cross-sectional view showing a semiconductor chip package using a tape circuit substrate according to a second embodiment of the present invention.
Figure 7:
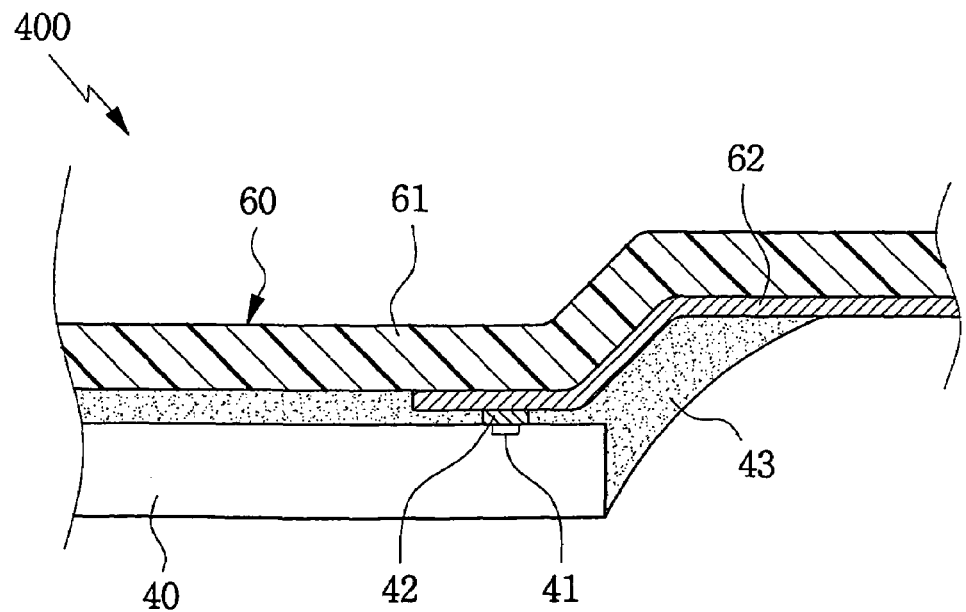
FIG. 7 is a cross-sectional view showing a semiconductor chip package using a tape circuit substrate according to a third embodiment of the present invention.

The tape circuit substrate having wavy beam leads can be applied to other types of the packages as well. FIGS. 6 and 7 show respectively, in a cross-sectional view, semiconductor chip packages according to a second and third embodiment of the present invention.

The package 300 of the second embodiment, shown in FIG. 6, is similar to the package of the first embodiment shown in FIG. 4B. However, the package 300 of FIG. 6 differs from that of FIG. 4B in that beam leads 52 of a tape circuit substrate 50 are formed on the top surface of a base film 51, and a protective layer 53 may be formed on the beam leads 52 and the top surface of the base film 51. Though not depicted in FIG. 6, the beam lead 52 in this embodiment has a wavy portion as well that could be configured in various shapes and dimensions as discussed above and illustrated in FIGS. 5A to 5C.

The package 400 of the third embodiment is characterized by not having an opening in a base film 61 of a tape circuit substrate 60, as shown in FIG. 7. Further, the base film 61 has a substantially uniform thickness that follows the contours of beam leads 62. This type of package may be available for narrower-pitch and thinner packaging technology. Like the embodiments described above, a wavy portion is formed in the beam lead 62 in this embodiment to improve interconnection reliability between the IC chip 40 and the tape circuit substrate 60.

Figure 8:
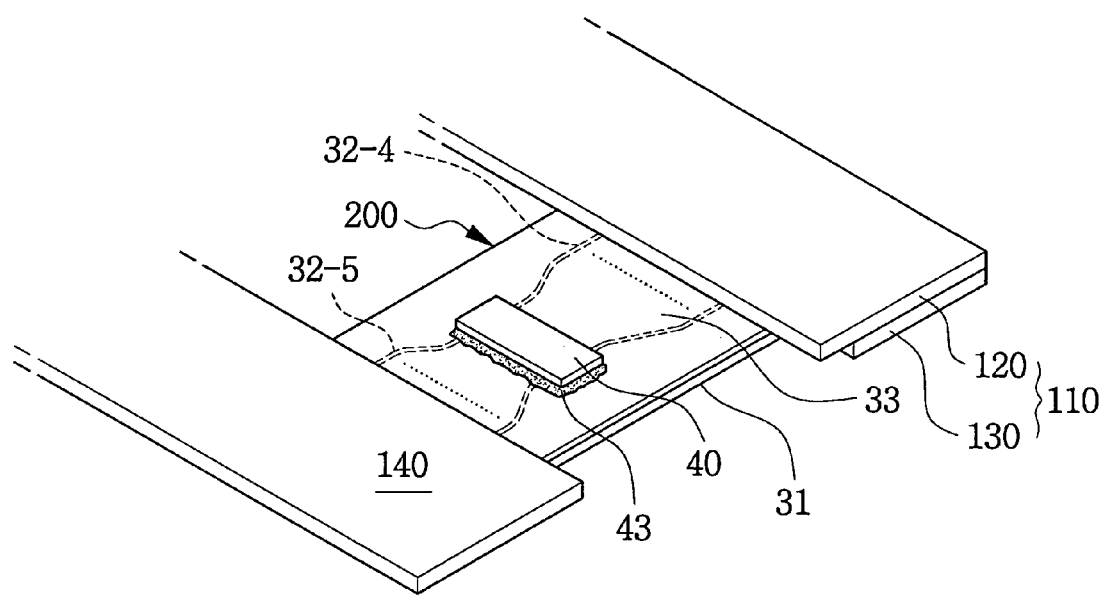
FIG. 8 is a perspective view illustrating a mounting structure of the semiconductor chip package according to the first, second, or third embodiment of the present invention.

These three types of packages described previously can be applied to, for example, an LCD module. FIG. 8 shows, in a perspective view, a mounting structure of the package on the LCD module. As an illustration in FIG. 8, the package 200 of the first embodiment is turned upside down. Since LCD modules are well known in the art, it is not necessary for understanding of the present invention to include detailed illustration and description about the LCD module.

Referring to FIG. 8, the package 200 is mounted on both an LCD panel 110 and a printed circuit board (PCB) 140. The LCD panel 110 is composed of two boards, e.g., a thin film transistor (TFT) board 120 and a color filter board 130. The beam leads 32-4 and 32-5 of the package 200 are formed in the direction of the base film 31 from both sides of the IC chip 40. The respective outer ends of the beam leads 32-4 and 32-5 are connected as external connection terminals to the LCD panel 110 and the PCB 140. In other words, the beam leads acting as output wirings 32-4 are connected under thermo-compression to input pads (not shown) of the TFT board 120, and the beam leads acting as input wirings 32-5 are connected under thermo-compression to output pads (not shown) of the PCB 140.

The tape circuit substrate having wavy beam leads can be alternatively applied to other types of the packages.

Figure 9A:
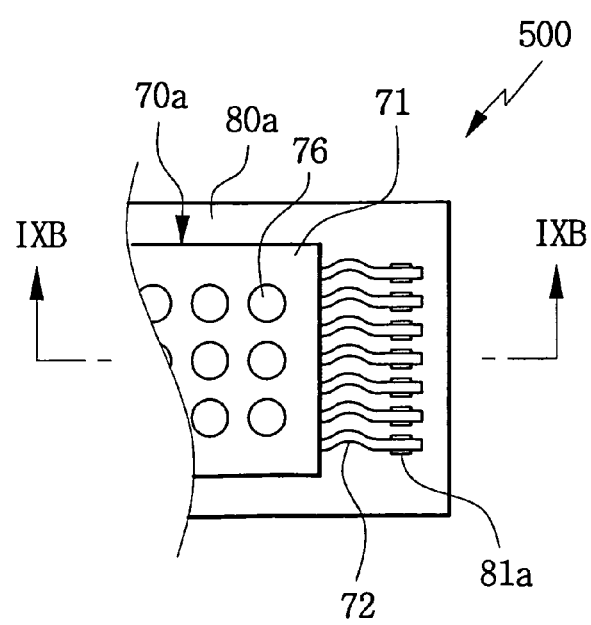
FIG. 9A is a plan view of a semiconductor chip package according to a fourth embodiment of the present invention.
Figure 9B:
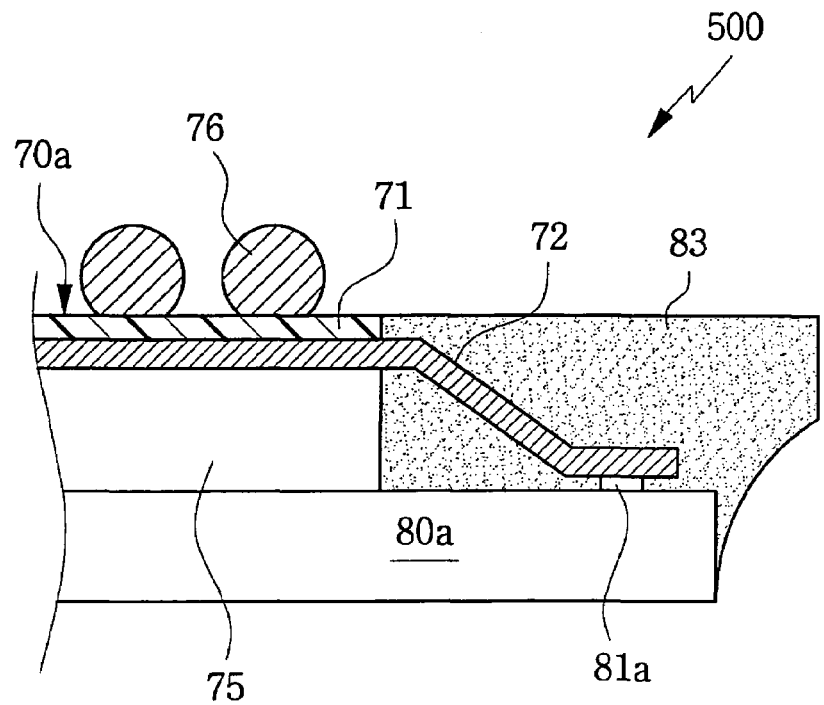
FIG. 9B is a cross-sectional view of the semiconductor chip package taken along line IXB—IXB of FIG. 9A.

As illustrated in FIGS. 9A and 9B, the package 500 includes a tape circuit substrate 70a and an IC chip 80a, both of which are interconnected by using the ILB process of the TAB technique.

The IC chip 80a has a plurality of chip pads 81a, which are arranged along peripheral regions of the top surface of the IC chip 80a. As described above, a chip bump can be formed on the chip pad 81a. The tape circuit substrate 70a has a base film 71 and a plurality of beam leads 72. The tape circuit substrate 70a is above the IC chip 80a, and the chip pads 81a are exposed to the outside of the tape circuit substrate 70a for the ILB process. Preferably, an adhesive material 75 can be interposed between the IC chip 80a and the tape circuit substrate 70a. For example, the adhesive material 75 can be an epoxy resin, an elastomeric polymer, or a silicone polymer.

The beam leads 72 are formed on the bottom surface of the base film 71. One end portion of each beam lead 72 is protruded toward the chip pad 81a from the base film 71. The protruded portions of the beam leads 72 are bonded to the chip pads 81a though the ILB process. Like the embodiments described above, each beam lead 72 has a wavy portion capable of dispersing the stress produced during the ILB process. One skilled in the art will appreciate that the wavy portion in this embodiment can have various shapes and dimensions as discussed above and illustrated in FIGS. 5A to 5C.

A sealing resin 83 such as epoxy encapsulates the protruded portions of the beam leads 72 together with the top and side surfaces of the IC chip 80a. For clarity, FIG. 9A does not show the sealing resin 83. If necessary, the bottom surface of the IC chip 80a can be also encapsulated. As external connection terminals, a plurality of solder balls 76 are formed in a grid pattern on the top surface of the base film 71. Each solder ball 76 is joined to the beam lead 72 through a hole (not shown) in the base film 71.

Depending on the arrangement pattern of the chip pads, the structure of the package can be changed in part as in the present invention.

Figure 10A:
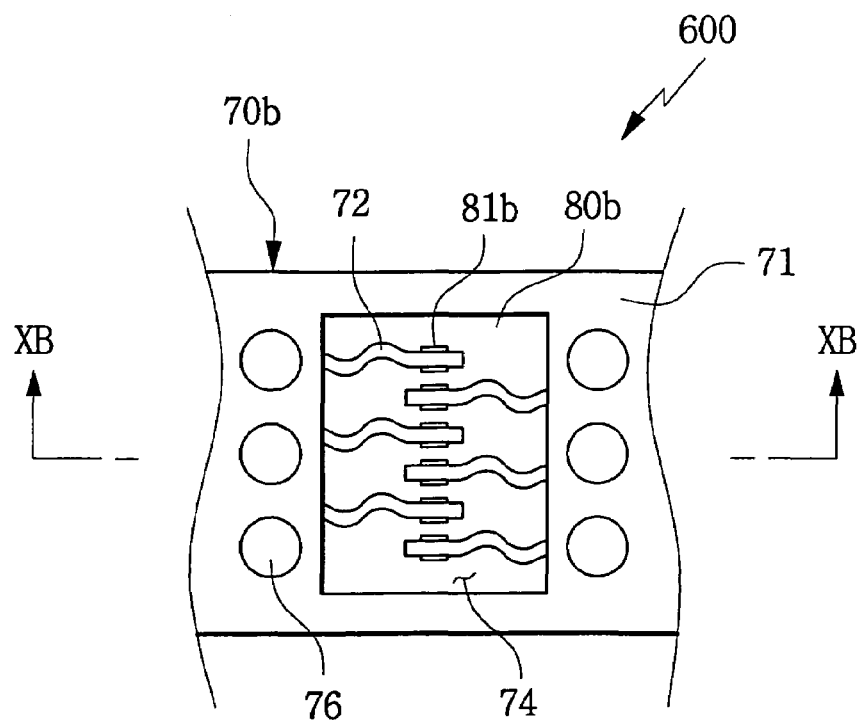
FIG. 10A is a plan view of a semiconductor chip package according to a fifth embodiment of the present invention.
Figure 10B:
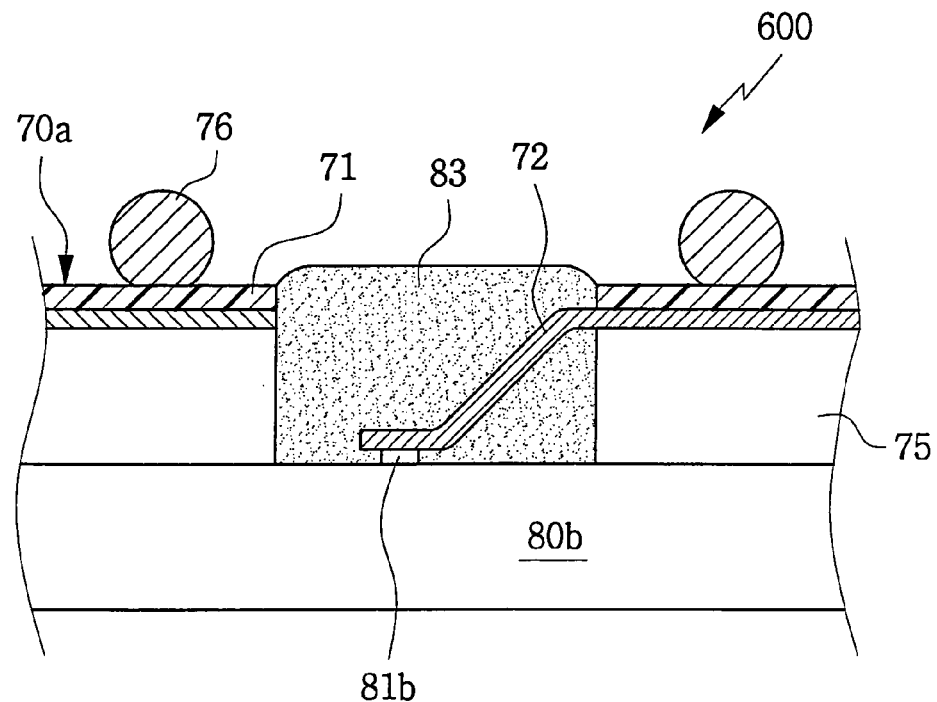
FIG. 10B is a cross-sectional view of the semiconductor chip package taken along line XB—XB of FIG. 10A.

Referring to FIGS. 10A and 10B, the package 600 also has a tape circuit substrate 70b and an IC chip 80b, both of which are interconnected by using the ILB process of the TAB technique.

The IC chip 80b has a plurality of chip pads 81b, which are arranged along central regions of the top surface of the IC chip 80b. The tape circuit substrate 70b has, therefore, an opening 74 to expose the IC chip 80b for the ILB process.

The tape circuit substrate 70b, which has a base film 71 and beam leads 72, is located above the IC chip 80b. An adhesive material 75 such as an epoxy resin, an elastomeric polymer or a silicone polymer is interposed between the IC chip 80b and the tape circuit substrate 70b.

The beam leads 72 are formed on the bottom surface of the base film 71. One end portion of each beam lead 72 is protruded into the opening 74 from the base film 71. The protruded portions of the beam leads 72 are bonded to the chip pads 81b though the ILB process. Like the embodiments described above, each beam lead 72 has a wavy portion capable of dispersing the stress produced during the ILB process. A sealing resin 83 such as epoxy encapsulates the opening 74 to cover the protruded portions of the beam leads 72 and the top surface of the IC chip 80b. If necessary, the side and bottom surfaces of the IC chip 80b can also be encapsulated. A plurality of solder balls 76 are formed as external connection terminals on the top surface of the base film 71 and are electrically connected to the beam leads 72 through holes (not shown) in the base film 71.

Figure 11:
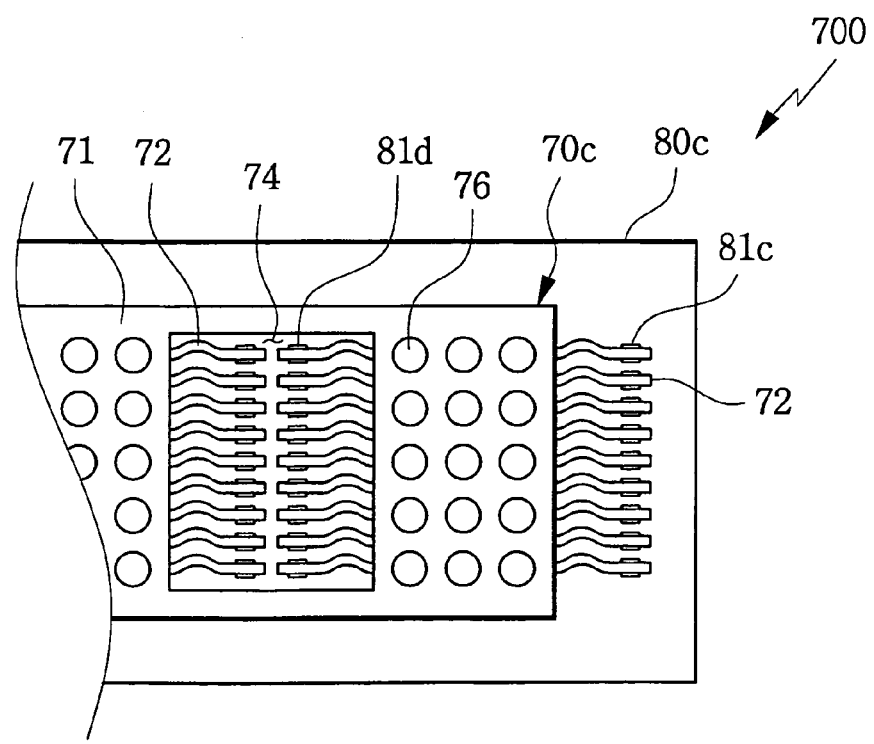
FIG. 11 is a plan view showing a semiconductor chip package using a tape circuit substrate according to a sixth embodiment of the present invention.

The chip pads of the IC chip can be arranged along peripheral regions and central regions of the top surface of the IC chip according to a sixth embodiment of the present invention. As shown in FIG. 11, some chip pads 81c are arranged along peripheral regions and the other chip pads 81d are arranged along central regions.

To expose the chip pads 81c and 81d, a tape circuit substrate 70c not only has a smaller size than that of the IC chip 80c, but it also has an opening 74 at its central portion. The tape circuit substrate 70c has a base film 71 and beam leads 72, and an adhesive material (not shown) is interposed between the IC chip 80c and the tape circuit substrate 70c. The beam leads 72 formed on the bottom surface of the base film 71 are bonded to the chip pads 81c and 81d though the ILB process. Like the former embodiments, each beam lead 72 has a wavy portion capable of dispersing the stress produced during the ILB process. A sealing resin (not shown) encapsulates the opening 74 and the top surface of the IC chip 80c. The sealing resin can encapsulate the side and bottom surfaces of the IC chip 80c. Solder balls 76 are formed on the base film 71 and joined to the beam leads 72.

Figure 12:
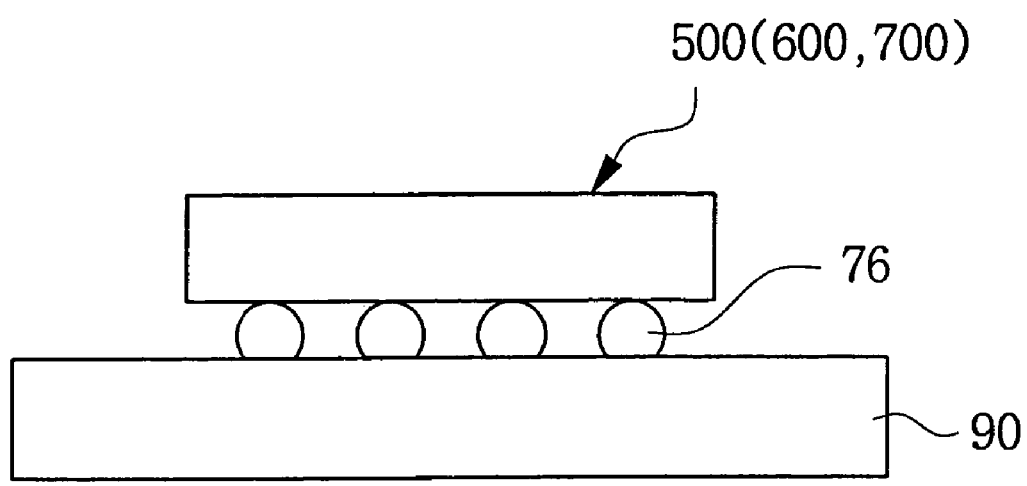
FIG. 12 is a cross-sectional view illustrating a mounting structure of the semiconductor chip package according to the fourth, fifth, or sixth embodiment of the present invention.

As shown in FIG. 12, the latter three types of the packages, 500, 600, or 700 all having ball-type terminals, are directly mounted on an external circuit board 90 through the solder balls 76. This is widely known as a flip chip bonding technique.

As described previously, the wavy portion of the beam lead disperses the stress produced during the ILB process, so that a crack or a break of the beam lead can be effectively prevented. Therefore, the semiconductor chip package of the present invention can improve interconnection reliability between the IC chip and the tape circuit substrate While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A tape circuit substrate comprising:
   a base film; and
   a plurality of beam leads adjacent to the base film having a length and a width, each beam lead including a widthwise wavy portion, wherein the base film has a substantially uniform thickness that follows the contours of the beam leads and does not have an opening extending therethrough.

2. The tape circuit substrate of claim 1, wherein the base film includes a flexible film.

3. The tape circuit substrate of claim 1, wherein the widthwise wavy portion of the beam lead includes a semicircular widthwise wavy portion, an S-shaped widthwise wavy portion, or a zigzag widthwise wavy portion.

4. A semiconductor chip package comprising:
   an integrated circuit chip including a plurality of chip pads formed on a top surface thereof; and
   a tape circuit substrate including:
      a base film having a top surface;
      a plurality of beam leads having a length and a width formed on the top surface of the base film, wherein one end portion of the beam lead extends toward the chip pad from the base film and is bonded to the chip pad, and wherein the extended portion of the beam lead has a widthwise wavy portion; and
      a protective layer covering the beam leads and the top surface of the base film.

5. The semiconductor chip package of claim 4, wherein the base film includes a flexible film.

6. The semiconductor chip package of claim 4, wherein the widthwise wavy portion of the beam lead includes a semicircular widthwise wavy portion, an S-shaped widthwise wavy portion, or a zigzag widthwise wavy portion.

7. The semiconductor chip package of claim 4, wherein the widthwise wavy portion of the beam lead includes a neck part, a bent part, and an end part.

8. The semiconductor chip package of claim 7, wherein the neck part has a length ranging from about 40 μm to about 80 μm, the bent part has a length ranging from about 100 μm to about 500 μm, and the beam lead has a width of about 50 μm or less.

9. The semiconductor chip package of claim 8, wherein the length of the neck part ranges from about 55 μm to about 75 μm.

10. The semiconductor chip package of claim 8, wherein the width of the beam lead ranges from about 10 μm to about 30 μm.

11. The semiconductor chip package of claim 4, wherein the integrated circuit chip further includes a plurality of chip bumps formed on the chip pads.

12. The semiconductor chip package of claim 4, further comprising:
   a sealing resin encapsulating the chip pads and the widthwise wavy portions of the beam leads.

13. The semiconductor chip package of claim 4, wherein the other end portion of each beam lead is an external connection terminal.

14. The semiconductor chip package of claim 4, wherein an opening is formed on a substantially central portion of the base film so that the chip pads of the integrated circuit chip are exposed through the opening.

15. The semiconductor chip package of claim 4, wherein the top surface of the base film faces toward the top surface of the integrated circuit chip.

16. The semiconductor chip package of claim 4, wherein the top surface of the base film faces the same direction as the top surface of the integrated circuit chip.

17. The semiconductor chip package of claim 4, wherein the base film covers the top surface of the integrated circuit chip, and the top surface of the base film faces toward the top surface of the integrated circuit chip.

18. A semiconductor chip package comprising:
   an integrated circuit chip including a plurality of chip pads formed on a top surface thereof; and a tape circuit substrate including a base film, a plurality of beam leads formed on a first surface of the base film, and a plurality of solder balls formed on a second surface of the base film, wherein a first end portion of each beam lead is electrically connected to the solder ball, wherein a second end portion of each beam lead is protruded toward the chip pad from the base film and bonded to the chip pad, and wherein the protruded portion of each beam lead has a wavy portion.

19. The semiconductor chip package of claim 18, wherein the tape circuit substrate is located above the top surface of the integrated circuit chip and the chip pads are exposed outside of the tape circuit substrate.

20. The semiconductor chip package of claim 18, wherein the chip pads are arranged along peripheral regions of the top surface of the integrated circuit chip.

21. The semiconductor chip package of claim 18, wherein the chip pads are arranged along central regions of the top surface of the integrated circuit chip.

22. The semiconductor chip package of claim 18, wherein the chip pads are arranged along both the peripheral regions and central regions of the top surface of the integrated circuit chip.

23. The semiconductor chip package of claim 18, further comprising:
an adhesive interposed between the first surface of the tape circuit and the top surface of the integrated circuit chip.

24. The semiconductor chip package of claim 23, wherein the adhesive includes at least one of epoxy resin, elastomeric polymer, and silicone polymer.

25. The semiconductor chip package of claim 18, further comprising:
a sealing resin encapsulating the chip pads and the wavy portions of the beam leads.

26. The semiconductor chip package of claim 18, wherein the wavy portion of the beam lead includes a semicircular wavy portion, an S-shaped wavy portion, or a zigzag wavy portion.

27. The semiconductor chip package of claim 18, wherein the wavy portion of the beam lead includes a neck part, a bent part, and an end part.

28. The semiconductor chip package of claim 27, wherein the neck part has a length ranging from about 40 μm to about 80 μm, the bent part has a length ranging from about 100 μm to about 500, and the beam lead has a width of about 50 μm or less.

29. The semiconductor chip package of claim 27, wherein the length of the neck part ranges from about 55 μm to about 75 μm.

30. The semiconductor chip package of claim 27, wherein the width of the beam lead ranges from about 10 μm to about 30 μm.

31. A semiconductor chip package comprising:
an integrated circuit chip including a plurality of chip pads formed on a top surface thereof; and
a tape circuit substrate including:
a base film having an opening formed therethrough, the opening defining an inside edge; and
a plurality of beam leads formed on the base film, wherein each beam lead includes a neck portion extending substantially laterally from the edge of the base film into the opening and a widthwise wavy portion extending from the neck portion through the opening toward at least one of the chip pads formed on the top surface of the integrated circuit chip.

32. The semiconductor chip package of claim 31, wherein each beam lead further comprises an end portion extending from the widthwise wavy portion substantially laterally toward at least one of the chip pads formed on the top surface of the integrated circuit chip.

33. The semiconductor chip package of claim 31, wherein the widthwise wavy portion of the beam lead extends straight into the opening from the neck portion and bends downward toward the chip pads.

34. The semiconductor chip package of claim 31, wherein the widthwise wavy portion is adapted to move laterally during an inner lead bonding process.

35. A tape circuit substrate comprising:
a flexible base film; and
a plurality of beam leads adjacent the base film, each beam lead including a wavy portion, wherein the base film has a substantially uniform thickness that follows the contours of the beam leads, and wherein the base film does not have an opening extending therethrough.

36. The tape circuit substrate of claim 35, wherein the wavy portion of the beam lead includes a semicircular wavy portion, an S-shaped wavy portion, or a zigzag wavy portion.

37. A tape circuit substrate comprising:
a base film; and
a plurality of beam leads adjacent to the base film, each beam lead including a neck portion extending substantially laterally from the base film and a widthwise wavy portion extending from the neck portion, wherein the widthwise wavy portion of the beam lead includes a semicircular widthwise wavy portion or an S-shaped widthwise wavy portion.

38. The tape circuit substrate of claim 37, wherein the base film includes a flexible film.

39. A tape circuit substrate comprising:
a base film; and
a plurality of beam leads adjacent to the base film having a length and a width, each beam lead including a widthwise wavy portion, wherein the base film has a substantially uniform thickness that follows substantially the entire contours of the beam.

* * * * *